United States Patent
Ko

(10) Patent No.: US 8,277,109 B2
(45) Date of Patent: Oct. 2, 2012

(54) LED LIGHTING DEVICE WITH THERMALLY CONDUCTIVE RESIN LAMPSTAND

(75) Inventor: Chiu-Shuang Ko, Taichung County (TW)

(73) Assignee: LEDRAY Technology Co., Ltd., Taichung (TW)

( * ) Notice: Subject to any disclaimer, the term of this patent is extended or adjusted under 35 U.S.C. 154(b) by 321 days.

(21) Appl. No.: 12/479,764

(22) Filed: Jun. 6, 2009

(65) Prior Publication Data

US 2009/0303719 A1    Dec. 10, 2009

(30) Foreign Application Priority Data

Jun. 9, 2008   (TW) ............................... 97210170 U

(51) Int. Cl.
*H01R 33/05* (2006.01)
*F21V 29/00* (2006.01)

(52) U.S. Cl. .................. 362/647; 362/249.02; 362/294; 362/373; 362/545

(58) Field of Classification Search .................. 362/612, 362/555, 545, 547, 647–659, 249.02, 294, 362/373
See application file for complete search history.

(56) References Cited

U.S. PATENT DOCUMENTS

| | | | |
|---|---|---|---|
| 3,821,590 A | 6/1974 | Kosman | |
| 4,277,819 A * | 7/1981 | Sobota et al. | 362/545 |
| 4,466,050 A | 8/1984 | Lockard | |
| 4,600,977 A | 7/1986 | Barlian | |
| 4,745,534 A | 5/1988 | Brunner | |
| 4,812,814 A | 3/1989 | Elliott | |
| 5,177,593 A | 1/1993 | Abe | |
| 5,632,551 A * | 5/1997 | Roney et al. | 362/485 |
| 6,355,946 B1 | 3/2002 | Ishinaga | |
| 6,371,636 B1 * | 4/2002 | Wesson | 362/545 |
| 6,462,475 B1 * | 10/2002 | Lee | 315/57 |
| 6,799,864 B2 * | 10/2004 | Bohler et al. | 362/236 |
| 7,098,485 B2 | 8/2006 | Isokawa | |
| 7,236,366 B2 | 6/2007 | Chen | |
| 7,358,679 B2 * | 4/2008 | Lys et al. | 315/51 |
| 7,559,674 B2 * | 7/2009 | He et al. | 362/249.02 |
| 7,854,535 B2 | 12/2010 | Weng | |
| 7,866,838 B2 * | 1/2011 | Wang et al. | 362/85 |
| 2002/0153835 A1 | 10/2002 | Fujiwara | |
| 2002/0176250 A1 | 11/2002 | Bohler | |
| 2003/0116769 A1 | 6/2003 | Song | |
| 2003/0189830 A1 | 10/2003 | Sugimoto | |
| 2004/0140765 A1 | 7/2004 | Takekuma | |
| 2004/0264196 A1 | 12/2004 | Shu | |
| 2006/0227558 A1 | 10/2006 | Osawa | |
| 2006/0274529 A1 * | 12/2006 | Cao | 362/294 |
| 2007/0230186 A1 * | 10/2007 | Chien | 362/294 |
| 2007/0242461 A1 * | 10/2007 | Reisenauer et al. | 362/294 |
| 2008/0080187 A1 * | 4/2008 | Purinton | 362/294 |
| 2009/0244899 A1 * | 10/2009 | Chyn | 362/294 |

* cited by examiner

*Primary Examiner* — Ismael Negron

(74) *Attorney, Agent, or Firm* — Vierra Magen Marcus & DeNiro LLP

(57) ABSTRACT

A LED lighting device includes a cooling lampstand, a circuit, at least one light emitting diode (LED), a sealant and a power converter. The cooling lampstand is made by a resin composition in which the thermal conductivity of the resin composition is about 1-50 W/mk. The circuit directly is disposed on the cooling lampstand. The light emitting diode (LED) is disposed on the cooling lampstand and electrically connected to the circuit. The sealant covers the LED. The power converter is electrically connected to the circuit for supplying an electrical power to the circuit.

14 Claims, 2 Drawing Sheets

LED LIGHTING DEVICE WITH THERMALLY CONDUCTIVE RESIN LAMPSTAND

RELATED APPLICATIONS

This application claims priority to Taiwan Utility Model Patent Application Number 97210170, filed Jun. 9, 2008, which is herein incorporated by reference.

BACKGROUND

1. Technical Field

The present disclosure relates to a lamp. More particularly, the present disclosure relates to a light emitting diode (LED) lamp.

2. Description of Related Art

The traditional LED lamp includes at least an LED, a circuit board and a lampstand. The LED is mounted on the circuit board, and the circuit board is inserted into the lampstand. The illuminating ability of the LED is greatly affected by the thermal. Therefore, the lampstand usually has some cooling structures to dissipate the thermal of the LED via the circuit board.

SUMMARY

A LED lighting device with thermally conductive resin lampstand is provided. The LED lighting device with thermally conductive resin lampstand includes a cooling lampstand, a circuit, at least one light emitting diode (LED), a sealant, and a power converter. The cooling lampstand is made out of one piece of a resin composition, and the thermal conductivity of the resin composition is about 1-50 W/mK. The circuit is directly disposed on the cooling lampstand. The light emitting diode (LED) is disposed on the cooling lampstand and electrically connected to the circuit. The sealant covers the LED, and the power converter is electrically connected to the circuit to supply an electrical power to the circuit.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Figure 1:
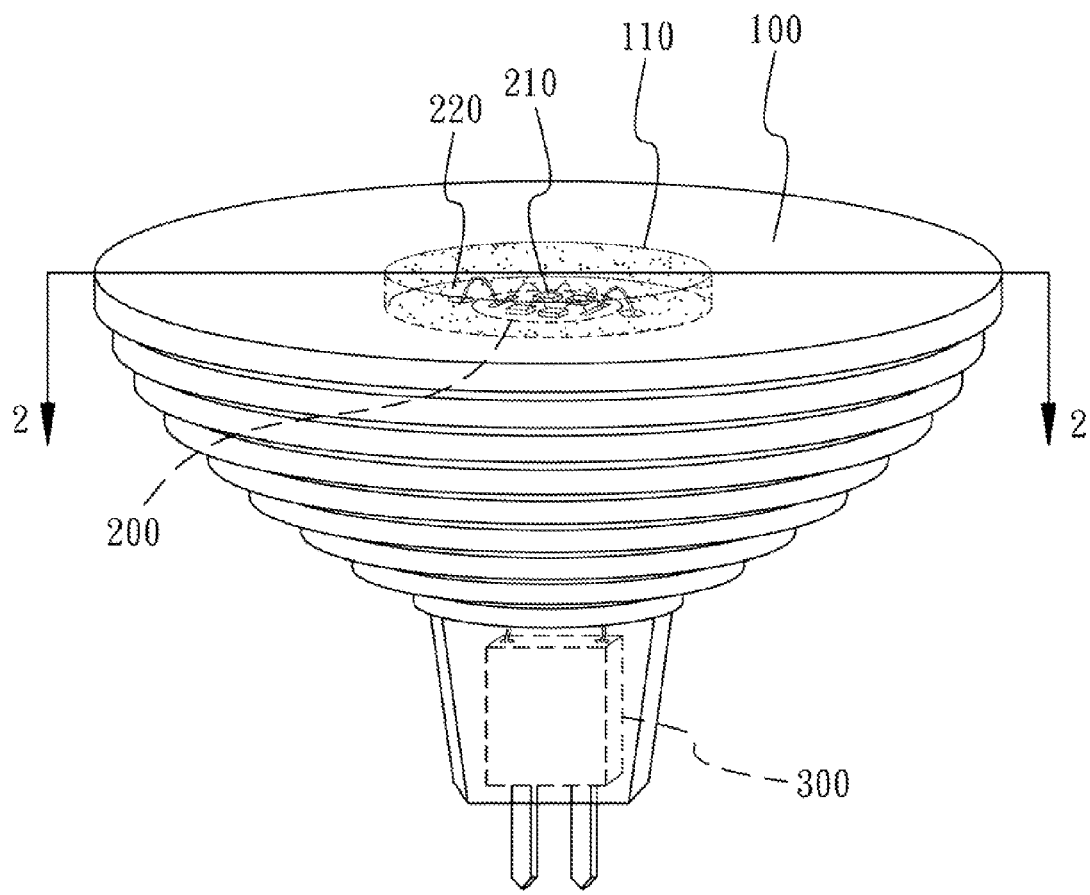
FIG. 1 is a perspective view of a LED lighting device with thermally conductive resin lampstand according to one embodiment of the to present invention.
Figure 2:
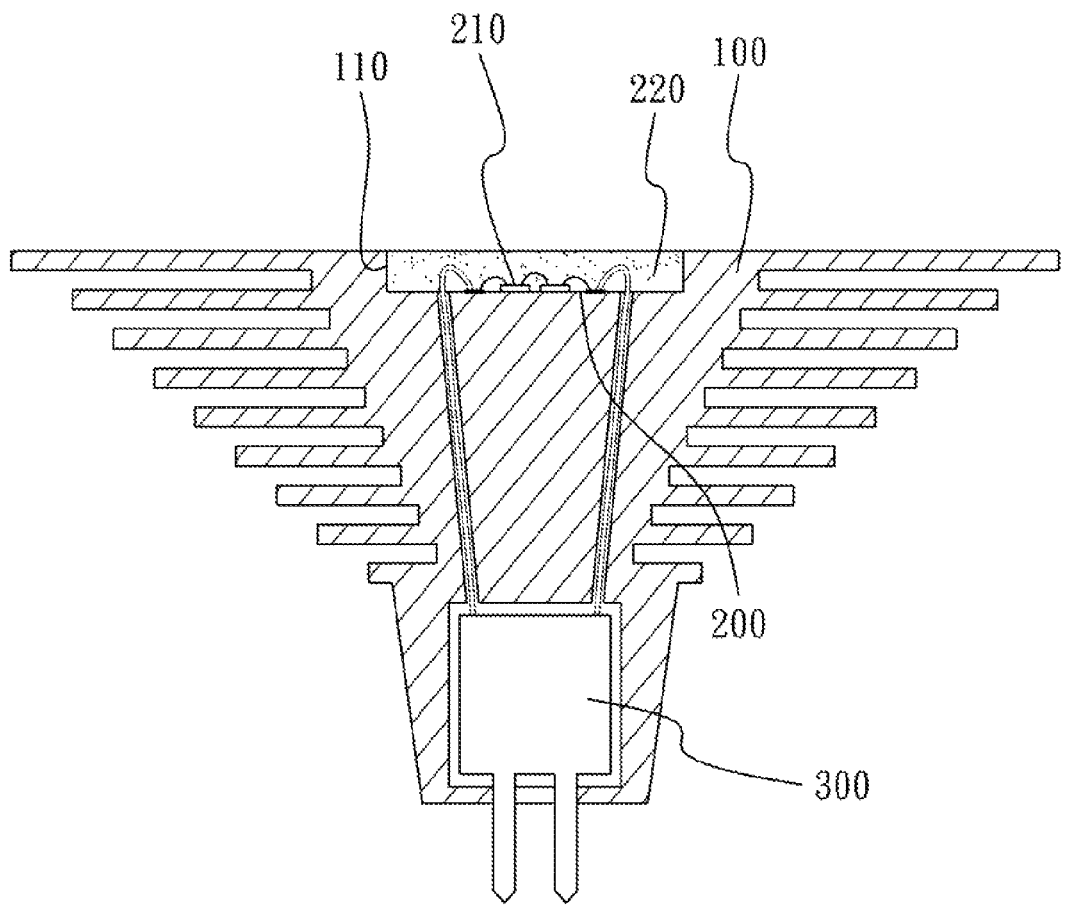
FIG. 2 is a cross-sectional view taken along the line 2-2 of FIG. 1.

FIG. 1 is a perspective view of a LED lighting device with thermally conductive resin lampstand according to one embodiment of the present invention. FIG. 2 is a cross-sectional view taken along the line 2-2 of FIG. 1. The LED lighting device with thermally conductive resin lampstand includes a cooling lampstand 100, a circuit 200, at least one light emitting diode (LED) 210, a sealant 220, and a power converter 300. The cooling lampstand 100 is made out of one piece of a resin composition, and the thermal conductivity of the resin composition is about 1-50 W/mK. The circuit 200 is directly disposed on the cooling lampstand 100. The light emitting diode (LED) 210 is disposed on the cooling lampstand 100 and electrically connected to the circuit 200. The sealant 220 covers the LED 210, and the power converter 300 is electrically connected to the circuit 200 to supply an electrical power to the circuit 200.

The term "about" as used herein may be applied to modify any quantitative representation which could permissibly vary without resulting in a change in the basic function to which it is related. For example, the resin composition as disclosed herein having a thermal conductivity of about 1-50 W/mK may permissibly have a thermal conductivity of less than 1 W/mK within the scope of the invention if its thermal conductive capability is not materially altered.

In detail, the cooling lampstand 100 is an injection molded cooling lampstand, and therefore the cost to manufacture a lampstand is reduced. On the other hand, the cooling lampstand 100 is made out of one piece without any faying junctions that increase the heat resistance.

In another embodiment, the resin composition can be made from three ingredients. The first ingredient is selected from the group consisting of polybutylene terephthalate (PBT), polyarylene sulfide, liquid crystal polymer, syndiotactic polystyrene (SPS), polyphthalamide, and a combination thereof. The first ingredient in the resin composition is 20-65 wt %.

The second ingredient is selected from the group consisting of aluminum oxide, magnesium oxide, silicon carbide, boron nitride, and a combination thereof. The second ingredient in the resin composition is 15~60 wt %.

The third ingredient is selected from the group consisting of glass fibers, carbon fibers, and a combination thereof. The third ingredient in the resin composition is 5~45 wt %.

In the other embodiment, the resin composition can be made from three ingredients. The first ingredient is an aromatic polycarbonate oligomer, and the first ingredient in the resin composition is 1-40 parts by weight. The second ingredient is a graphitized carbon fiber, and the second ingredient in the resin composition is 5-40 parts by weight. The third ingredient is a plurality of boron nitride particles, and the third ingredient in the resin composition is 5-100 parts by weight.

On the other hand, the resin composition can also be mixed with some thermal-conductive particles to enhance the thermal conductivity. Many fins are formed at the surface of the cooling lampstand 100 to increase the thermal dissipating ability.

The circuit 200 is directly disposed on the cooling lampstand 100 without using any circuit board. In other words, the cooling lampstand 100 provides low electric conductivity and high thermal conductivity to replace the printed circuit board and cooling structures.

The LED 210 is disposed on the cooling lampstand 100 and electrically connected to the circuit 200. In detail, a plurality of the LEDs are electrically connected together in series or in parallel. The LEDs can be LED dies or LED packages, and two electrodes of the LED can be located at the same terminal or opposite terminals.

In detail, the circuit 200 includes at least one high voltage line and one low voltage line. The LED 210 is located at the gap between the high voltage line and the low voltage line, and a bonding process is applied to produce bonding lines to electrically connect each of two electrons of the LED 210 to the high voltage line or the voltage line correspondingly.

The sealant covers the LED 210. In detail, the cooling lampstand 100 has an indentation zone 110 to contain the circuit 200 and the LED 210. A depth of the indentation zone 110 is less than or equal to 2 mm, and the sealant 220 fills the indentation zone 110 to protect the LED 210.

The power converter 300 is electrically connected to the circuit 200 to supply an electrical power thereto. The power converter 300 can be isolated from the cooling lampstand 100 or embedded in the cooling lampstand 100. The power converter 300 includes a plug when it is embedded in the cooling lampstand 100. The cooling lampstand 100 can be made in many standard formats, such as MR-16 and PAR-30. The power converter 300 can be made in many standard formats, such as E-27 and GU-10.

What is claimed is:

1. A LED lighting device with thermally conductive resin lampstand comprising:
    a cooling lampstand comprised of a resin composition, wherein the thermal conductivity of the resin composition is about 1-50 W/mK;
    a circuit directly disposed on the cooling lampstand;
    at least one light emitting diode (LED) disposed on the cooling lampstand and electrically connected to the circuit;
    a sealant directly disposed on the lampstand and fully covering the at least one LED; and
    a power converter electrically connected to the circuit for supplying an electrical power to the circuit.

2. The LED lighting device with thermally conductive resin lampstand of claim 1, wherein the cooling lampstand is made out of one piece by the resin composition.

3. The LED lighting device with thermally conductive resin lampstand of claim 1, wherein the LED is an LED die or an LED package.

4. The LED lighting device with thermally conductive resin lampstand of claim 1, wherein the resin composition comprises a plurality of thermal-conductive particles therein.

5. The LED lighting device with thermally conductive resin lampstand of claim 1, wherein the power converter is embedded in the cooling lampstand.

6. The LED lighting device with thermally conductive resin lampstand of claim 1, wherein the resin composition is made from three ingredients:
    the first ingredient is selected from the group consisting of polybutylene terephthalate (PBT), polyarylene sulfide, liquid crystal polymer, syndiotactic polystyrene (SPS), polyphthalamide, and a combination thereof; wherein, the first ingredient in the resin composition is 20.about.65 wt %;
    the second ingredient is selected from the group consisting of aluminum oxide, magnesium oxide, silicon carbide, boron nitride, and a combination thereof; wherein, the second ingredient in the resin composition is 15.about.60 wt %; and
    the third ingredient is selected from the group consisting of glass fibers, carbon fibers, and a combination thereof; wherein, the third ingredient in the resin composition is 5.about.45 wt %.

7. The LED lighting device with thermally conductive resin lampstand of claim 1, wherein the resin composition is made from three ingredients:
    the first ingredient is an aromatic polycarbonate oligomer, wherein the first ingredient in the resin composition is 1-40 parts by weight;
    the second ingredient is a graphitized carbon fiber, wherein the second ingredient in the resin composition is 5-40 parts by weight; and
    the third ingredient is a plurality of boron nitride particles, wherein the third ingredient in the resin composition is 5-100 parts by weight.

8. The LED lighting device of claim 1, wherein:
    the circuit is directly disposed on the cooling lampstand without using a circuit board.

9. The LED lighting device of claim 1, wherein:
    at least a portion of the power converter is surrounded by the lampstand.

10. The LED lighting device with thermally conductive resin lampstand of claim 1, further comprising a plurality of the LEDs that are electrically connected together in series or in parallel.

11. The LED lighting device with thermally conductive resin lampstand of claim 10, wherein two electrodes of the LED are located at the same terminal of the LED.

12. The LED lighting device with thermally conductive resin lampstand of claim 1, wherein:
    the lampstand has an indentation zone; and
    the sealant is in the indentation zone.

13. The LED lighting device with thermally conductive resin lampstand of claim 12, wherein:
    a depth of the indentation zone is less than or equal to 2 mm.

14. A LED lighting device with thermally conductive resin lampstand comprising:
    a cooling lampstand having an indentation zone and made by a resin composition, wherein the thermal conductivity of the resin composition is about 1-50 W/mK;
    a circuit directly disposed on the cooling lampstand;
    at least one light emitting diode (LED) disposed on the cooling lampstand and electrically connected to the circuit;
    a sealant filling the indentation zone and fully covering the at least one LED; and
    a power converter electrically connected to the circuit for supplying an electrical power to the circuit, at least a portion of the power converter is surrounded by the lampstand.

* * * * *